United States Patent [19]

Yoshida

[11] Patent Number: 5,230,784

[45] Date of Patent: Jul. 27, 1993

[54] MICROWAVE PLASMA SOURCE

[75] Inventor: Yoshikazu Yoshida, Izumi, Japan

[73] Assignee: Matsushita Electric Industrial Co., Ltd., Osaka, Japan

[21] Appl. No.: 709,223

[22] Filed: Jun. 3, 1991

[30] Foreign Application Priority Data

Jun. 1, 1990 [JP] Japan ................. 2-144707

[51] Int. Cl.$^5$ ........................... C23C 14/34
[52] U.S. Cl. ................. 204/298.19; 204/298.16
[58] Field of Search ........... 156/345; 204/192.12, 204/298.02, 298.16, 298.19, 298.38; 315/111.21, 111.41, 111.71, 111.81; 250/423 R, 42 BF; 118/723

[56] References Cited

U.S. PATENT DOCUMENTS

| | | | |
|---|---|---|---|
| 4,721,553 | 1/1988 | Saito et al. | 204/298.16 X |
| 4,990,229 | 2/1991 | Campbell et al. | 204/298.16 X |
| 5,022,977 | 6/1991 | Matsuoka et al. | 204/298.16 |
| 5,034,086 | 7/1991 | Sato | 204/298.38 X |

OTHER PUBLICATIONS

"Electron Cyclotron Resonance Plasma Deposition Technique Using Raw Material Supply by Sputtering", Toshiro Ono et al., Japanese Journal of Applied Physics, vol. 23, No. 8, Aug. 1984, pp. L534–536.
"Ohyo-butsuri", vol. 57, 1988, Shigetomi Matsuoka et al., pp. 1301–1313. (An English language translation of abstract is attached.).

Primary Examiner—Nam X. Nguyen
Attorney, Agent, or Firm—Wenderoth, Lind & Ponack

[57] ABSTRACT

A microwave plasma source includes: a microwave source; a rectangular waveguide having the microwave source at one end thereof; a coaxial waveguide arranged so as to penetrate through the other end of the rectangular waveguide and having an outer conductor and an inner conductor both having a door-knob-shaped portion at one end thereof and an opening at the end thereof; a target holder, for holding a target through an electrically insulating member, and arranged at the end of the inner conductor near the opening thereof; a magnet arranged at the end of the inner conductor near the opening thereof; and a vacuum chamber connected to the openings of the ends of the inner and outer conductors and having a gas inlet and a gas outlet. A microwave field generated by from the microwave source is propagated to the target through a space formed between the inner and outer conductors of the coaxial waveguide and is radiated on the target, so that an electrical discharge is caused in the vacuum chamber in which gas is introduced from the gas inlet, and a plasma is generated on the target.

6 Claims, 3 Drawing Sheets

MICROWAVE PLASMA SOURCE

BACKGROUND OF THE INVENTION

The present invention relates to a microwave plasma source for forming a film on a target by sputtering such as a semiconductor process technique or a surface treatment.

A conventional microwave plasma source of the sputter-ECR (Electron Cyclotron Resonance) type is disclosed in "Ohyo-butsuri" Vol. 57, published in 1988, on page 1301, by Shigetomi MATSUOKA and Kenichi ONO and is described hereinbelow.

FIG. 3 shows the structural view of the apparatus. In FIG. 3, a resonance chamber 1 is shaped into a cylindrical waveguide operation in a TE112 mode in a vacuum. A microwave field of a frequency of 2.45 GHz is introduced in the resonance chamber 1 from a waveguide 2 through a vacuum sealing window 3. In the resonance chamber 1, a magnetic field intensity of 875G is applied to the microwave field of 2.45 GHz by an outer coil 4 in order to satisfy a specified ECR condition. Then, an electrical discharge gas, such as argon, is introduced in the resonance chamber 1 through a gas inlet 5. A cylindrical target 8 is arranged under the resonance chamber 1 while contacting a plasma extraction hole 6 of the resonance chamber 1 so as to surround a plasma flow 7. A substrate holder 9 and a substrate held on the substrate holder 9 are arranged under the target 8.

The operation of the apparatus is described hereinbelow.

Argon is used as an electrical discharge gas and a plasma is produced in the resonance chamber 1 within the pressure range of $10^{-4}$-$10^{-3}$ Torr. The plasma flows out as the plasma wave 7 of several electron volts to tens of electron volts, i.e., the plasma wave 7 with lower energy ions flows through the plasma extraction hole 6 in accordance with divergence magnetic field gradient of the coil 4. At that time, a negative DC voltage or RF energy (at a frequency of 13.56 MHz) is applied to the target 8, and then, ions in the plasma flow 7 are injected on the surface of the target 8 to generate sputtering. Some of the particles sputtered from the target 8 flow towards the target 10 to form a thin film thereof.

However, the above-described apparatus has the following disadvantages. The apparatus is large in size because a coil is used for generating the magnetic field and the plasma generating section and the sputtering section are separated from each other. Furthermore, it is difficult to produce a ring-shaped target.

SUMMARY OF THE INVENTION

Accordingly, an essential object of the present invention is to provide a microwave plasma source capable of being miniaturized and capable of easily producing a target.

In accomplishing these and other objects, according to one aspect of the present invention, there is provided a microwave plasma source comprising:

a microwave source;

a waveguide having the microwave source at one end thereof;

a coaxial waveguide arranged so as to penetrate through another end of the waveguide and having an outer conductor and an inner conductor both having a door-knobshaped portion at one end thereof and an opening at another end thereof;

a target holder, for holding a target with an electrically insulating member, arranged at the another end of the inner conductor near the opening thereof;

a magnet arranged at the another end of the inner conductor near the opening thereof; and a vacuum chamber connected to the openings of the ends of the inner and outer conductors and having a gas inlet and a gas outlet;

wherein a microwave field generated by the microwave source is propagated to the target through a space formed between the inner and outer conductors of the coaxial waveguide and is radiated onto the target, so that an electrical discharge is caused in the vacuum chamber in which a gas is introduced from the gas inlet, and a plasma is generated on the target.

By the above construction of the present invention, the target for magnetron sputtering is arranged at the end of the inner conductor and a microwave field may be radiated from the periphery of the target, so that the plasma generating section and the sputtering section are the same so as to use a normal target, for example, a disk-shaped target and be capable of being miniaturized. In the apparatus, the microwave field is propagated through the coaxial waveguide and is radiated onto the target. Thus, a microwave magnetron plasma capable of producing of high density plasma is generated on the target at a lower gas pressure, and a sputtering operation can be performed.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
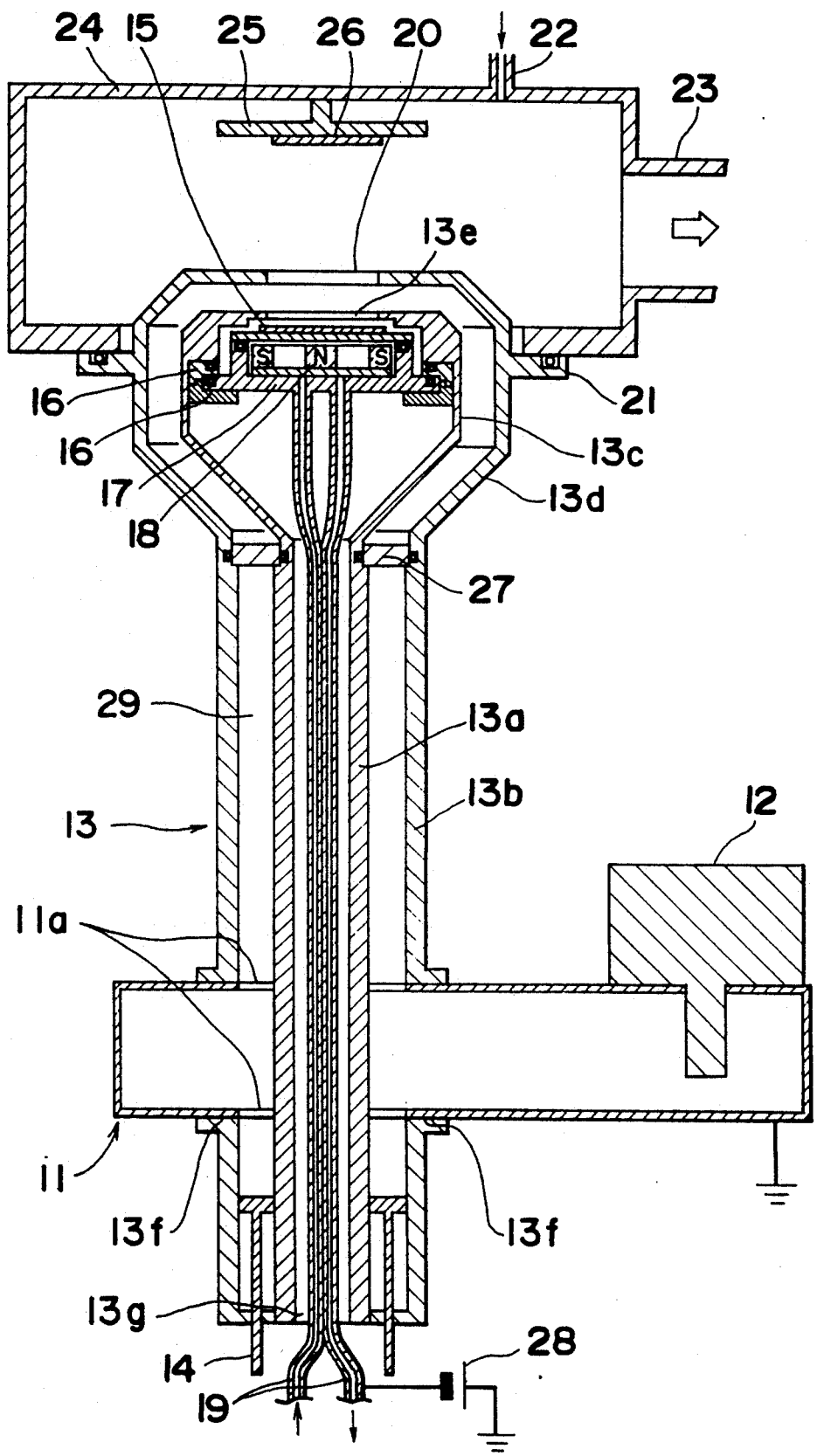
FIG. 1 is a cross-sectional view showing a microwave plasma source according to a first embodiment of the present invention.

In FIG. 1, a microwave plasma source according to a first embodiment of the present invention comprises: a rectangular waveguide 11, a magnetron 12 serving as a microwave source; a coaxial waveguide 13; a target holder 17 for holding a target 15; a permanent magnet 18, and a vacuum chamber 24. The magnetron 12 is arranged at one end of the rectangular waveguide 11. The coaxial waveguide 13 is arranged at the other end of the rectangular wave guide 11 and has an inner conductor 13a and an outer conductor 13b. That is, the rectangular waveguide 11 has openings 11a at the other end thereof and the other end of the rectangular waveguide 11 penetrates through openings 13f formed at one end, i.e., the lower end of the outer conductor 13b of the coaxial waveguide 13 in FIG. 1 so that the openings 11a of the rectangular waveguide 11 coincide with the openings 13f of the outer conductor 13b. Thus, a microwave field generated by the magnetron 12 is propagated from the rectangular waveguide 11 to the coaxial waveguide 13 through the openings 11a and 13f. A tuner 14 is installed at the lower end of a space 29 formed between the inner conductor 13a and the outer conductor 13b in FIG. 1 so as to be capable of changing the axial length of the volume defined between the outer surface of the inner conductor 13a and the inner surface of the outer conductor 13b. The other end of the coaxial waveguide 13, that is, each of the other end portions 13c and 13d of the inner conductor 13a and the outer conductor 13b is formed in a door-knob shape. The other end portion 13c of the inner conductor 13a is extended from the other end, i.e., the upper end of the inner conductor 13a while gradually enlarging the diameter thereof. That is, the outer shape of the other end portion 13c is formed by combining circular truncated cone shape, of which the inclined angle of the cross-sectional shape is between 30 and 60 deg., preferably 45 deg., and cylinder shape. The inside of the other end portion 13c of the inner conductor 13a is empty. The target 15 is supported by the target holder 17 electrically insulated with two Teflon plates 16 ("Teflon" is the trademark for polytetrafluoroethylene and is manufactured by du Pont) from the other end portion 13c, the target holder 17 being arranged at the upper end of the other end portion 13c in FIG. 1. Then, the target 15 is arranged inside the upper end of the other end portion 13c by the target holder 17 to be opposed to an opening 13e formed at the upper flat end of the other end portion 13c. The other end portion 13d of the outer conductor 13b is extended from the upper end of the outer conductor 13b while gradually enlarging the diameter thereof. That is, the outer shape of the other end portion 13d is formed by combining circular truncated cone shape, of which the inclined angle of the cross-sectional shape is 45 deg., and cylinder shape. The inside of the other end portion 13d of the outer conductor 13b is empty so that the other end portion 13c of the inner conductor 13a is covered with the other end portion 13d of the outer conductor 13b through a specified gap formed therebetween.

The permanent magnet 18 is arranged under the target 15. The permanent magnet 18 has a disk-shaped North magnetic pole and a ring-shaped South magnetic pole, both centers being the same and both poles being arranged through a magnetic gap in order to generate a magnetic field on the target 15. The permanent magnet 18 and the target 15 can be cooled with water. Water-cooling pipes 19 pass through the inside of the inner conductor 13a of which one end of each pipe is connected to the permanent magnet 18 through the target support 17 and the other end of each pipe is protrudes from the lower opening 13g of the inner conductor 13a. By applying an electrical potential to the pipes 19, the electrical potential of the target 15 can be changed.

The other end portion 13d of the outer conductor 13b has an opening 20 at the upper flat end thereof which has almost the same diameter as that of the target 15. The other end portion 13d thereof also has a flange 21 at the outer surface thereof, the flange 21 being attached to a vacuum chamber 24 having a gas inlet 22 and a gas outlet 23. A substrate holder 25 is arranged inside the vacuum chamber 24 so that the substrate holder 25 faces the opening 20, and holds a substrate 26 on the lower surface thereof. A glass plate 27 and a sealing member are arranged at the space formed at the portion where the inner and outer conductors 13a and 13b are respectively connected to the other end portions 13c and 13d thereof. Then, the the other end portions 13c and 13d are separated from the space between the inner and outer conductors 13a and 13b and sealed with the glass plate 27. Thus, it can prevent the glass plate 27 from blurring with sputter particles. The microwave field can pass through the glass plate 27.

According to the construction thereof, a microwave field of a frequency of 2.45 GHz generated by the magnetron 12 is propagated through the rectangular waveguide 11 of 109 mm × 54.5 mm in size, introduced into the coaxial waveguide 13 with the inner diameter of 24 mm and the outer diameter of 54 mm, and propagated through the space between the inner and outer conductors 13a and 13b and the space between the other end portions 13c and 13d, by changing the impedance in accordance with the change of the tuner position, resulting in it being radiated to the target 15. At that time, argon gas is introduced into the vacuum chamber 24 through the gas inlet 22 so that the gas pressure in the vacuum chamber 24 becomes equal to $2 \times 10^{-2}$ Torr, resulting in the starting of an electrical discharge. It is preferable to minimize the reflected wave of the microwave field by suitably changing the position of the tuner 14. Then, when the gas pressure in the vacuum chamber 24 becomes equal to $1 \times 10^{-3}$ Torr, a plasma is shifted into a magnetron discharge in which the magnetic field, on the target 25, of the permanent magnet 18 is captured by a magnetic gap of 120 Gauss. A DC power source 28 is electrically connected to the pipes 19 in order to apply a negative electric potential to the target 15, and then ions in the plasma are sputtered on the target 15. In the above case, although the magnetic field is 120 Gauss, the same advantages can be obtained with a magnetic field of 0.1–0.9 Kilo Gauss. Also, instead of a DC power source, a source for generating a high frequency or a blocking capacitor can be used.

Figure 2:
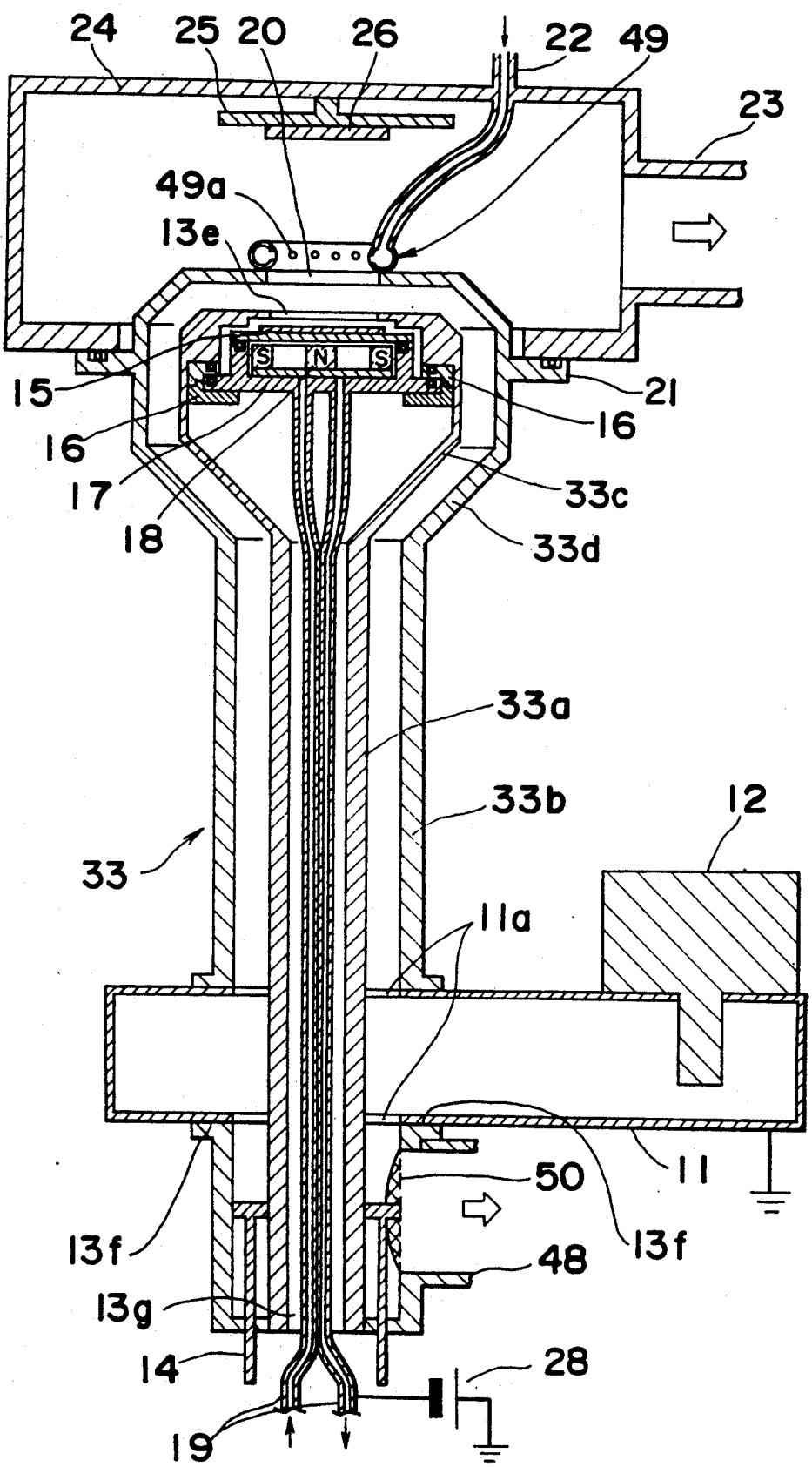
FIG. 2 is a cross-sectional view showing a microwave plasma source according to a second embodiment of the present invention.
Figure 3:
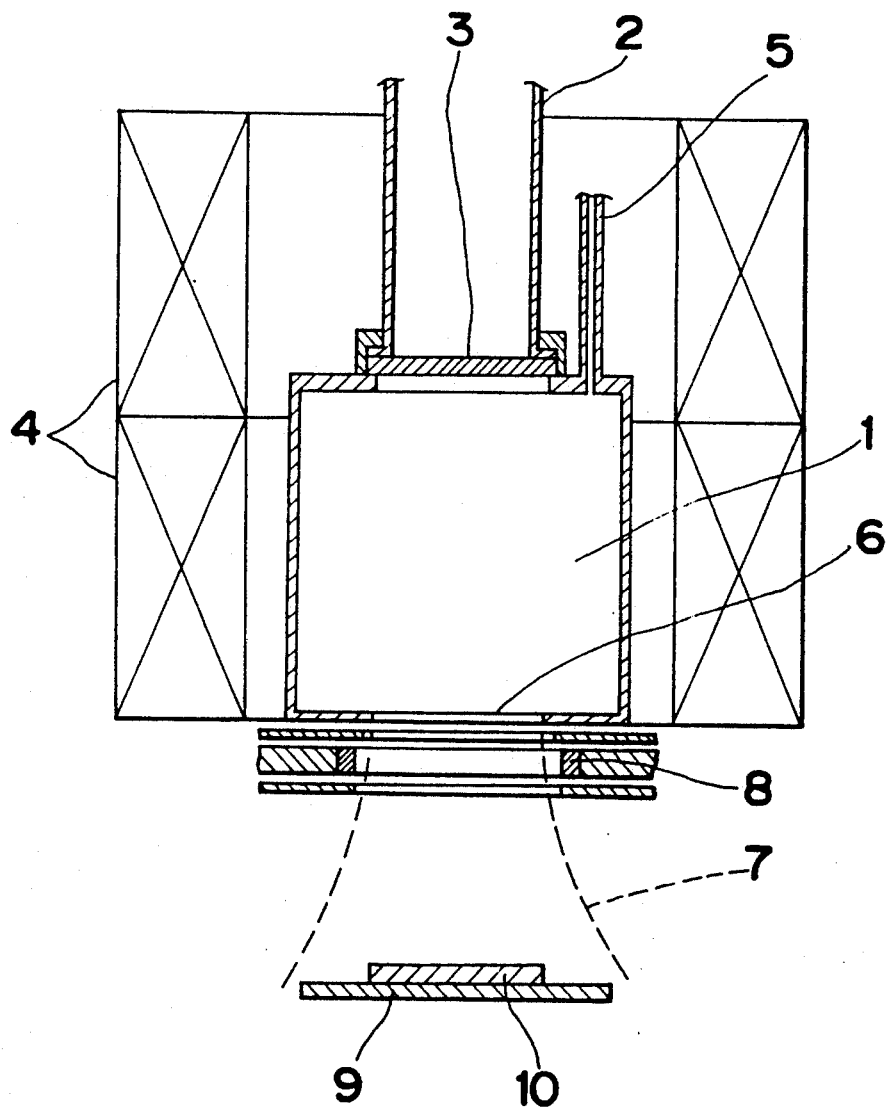
FIG. 3 is a cross-sectional view showing a conventional microwave plasma source.

FIG. 2 shows a microwave plasma source according to a second embodiment of the present invention. The construction of the apparatus is similar to that of the apparatus according to the first embodiment except that gas in the space between an inner and an outer conductors 33a and 33b of a coaxial waveguide 33 is discharged through an outlet 48 formed at the lower end of the coaxial waveguide 33. The inner and outer conductors 33a and 33b and the other end portions 33c and 33d thereof respectively correspond to the inner and outer conductors 13a and 13b and the other end portions 13c and 13d thereof. Moreover, in the second embodiment, the ring-shaped portion of a gas tube 49 is arranged around the opening 20 of the other end portion 33d in the vacuum chamber 24 while the other end of the gas tube 49 is connected to the gas inlet 22. The ring-shaped portion of the gas tube 49 has a plurality of holes 49a at the inner surface thereof.

According to the above construction thereof, gas such as argon is moved in the ring-shaped gas tube 49 from the gas inlet 22 and injected through the holes 49a of the gas tube 49 near the target 15. Then, the gas injected through the holes 49a passes through the space between the other end portions 33c and 33d and the space between the inner and outer conductors 33a and 33b in which the microwave field is also propagated. Then, the gas is discharged through a gas outlet 48 formed at the lower end of the outer conductor 33b near the tuner 14. A metal mesh 50 is arranged at the outlet 48 in order to prevent the microwave field from leaking through the outlet 48. When the gas pressure becomes equal to $8 \times 10^{-3}$ Torr in the vacuum chamber 24, an electrical discharge is started. The position of the tuner 14 is changed in order to minimize the reflected wave of the microwave field, so that the gas pressure is reduced to move the plasma on the target 15. Thus, the magnetron sputtering at a pressure of $2-5\times 10^{-4}$ Torr can be performed.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A microwave plasma source comprising:
   a microwave source;
   a rectangular waveguide having the microwave source at one end thereof;
   a coaxial waveguide arranged so as to penetrate through another end of the rectangular waveguide and having an outer conductor and an inner conductor both having a door-knob-shaped portion at one end thereof and an opening at another thereof;
   a target holder, for holding a target with an electrically insulating member, arranged inside the another end of the inner conductor near the opening thereof;
   a magnet arranged adjacent the target and at the another end of the inner conductor near the opening thereof; and
   a vacuum chamber connected to the openings of the ends of the inner and outer conductors and having a gas inlet and a gas outlet;
   wherein a microwave field generated by the microwave source is propagated to the target through a space formed between the inner and outer conductors of the coaxial waveguide and is radiated onto the target, so that an electrical discharge is caused in the vacuum chamber in which a gas is introduced from the gas inlet, and a plasma is generated on the target.

2. The microwave plasma source as claimed in claim 1, wherein the magnet is a permanent magnet having a disk consisting of one of north and south magnetic poles and a ring consisting of the other of the north and south magnetic poles, both the centers of the disk and the ring being the same, and wherein the magnetic field, on the target, of the permanent magnet is within a range of 0.1-0.9 Kilo Gauss.

3. The microwave plasma source as claimed in claim 1, wherein the inner and outer conductors have door-knob shaped portions including a cylindrical shape and a circular truncated cone shape, and inclined angles in the circular truncated cone in cross-section are between 30 and 60 degrees.

4. The microwave plasma source as claimed in claim 1, wherein the coaxial waveguide includes a tuner.

5. The microwave plasma source as claimed in claim 1, wherein the target holder includes a means for applying a D.C. voltage to the target.

6. The microwave plasma source as claimed in claim 1, wherein the target holder includes a means for applying a high frequency voltage to the target.

* * * * *